US012570808B2

(12) United States Patent
Fan et al.

(10) Patent No.:  US 12,570,808 B2
(45) Date of Patent:       Mar. 10, 2026

(54) PRESSURE-INDUCED CRYSTALLIZATION AND TOPOCHEMICAL CROSS-LINKING OF CONJUGATED POLYMERS

(71) Applicant: National Technology & Engineering Solutions of Sandia, LLC, Albuquerque, NM (US)

(72) Inventors: Hongyou Fan, Albuquerque, NM (US); Yang Qin, Storrs, CT (US)

(73) Assignees: National Technology & Engineering Solutions of Sandia, LLC, Albuquerque, NM (US); UNM Rainforest Innovations, Albuquerque, NM (US)

( * ) Notice: Subject to any disclaimer, the term of this patent is extended or adjusted under 35 U.S.C. 154(b) by 325 days.

(21) Appl. No.: 18/543,275

(22) Filed: Dec. 18, 2023

(65) Prior Publication Data

US 2025/0197571 A1      Jun. 19, 2025

(51) Int. Cl.
C30B 1/12          (2006.01)
C08J 3/24          (2006.01)
C30B 29/58         (2006.01)

(52) U.S. Cl.
CPC     C08J 3/24 (2013.01); C30B 1/12 (2013.01); C30B 29/58 (2013.01); C08J 2349/00 (2013.01)

(58) Field of Classification Search
CPC .... C30B 1/12; C30B 29/58; C08J 3/24; C08J 2349/00
See application file for complete search history.

(56) References Cited

U.S. PATENT DOCUMENTS 6,417,245 B1 *    7/2002  Fowler .................... C08F 36/22
                                                522/158

OTHER PUBLICATIONS

Xiao et al. "A supramolecular solution to a long standing problem: the L6-polymerization of a triacetylene" Ange Chem Int 2000, vol. 39 No. 12 2132-2135.*

Rives et al "First Perphenylated carbo-Oligoacetylenes: An Extension of the Polytriacetylene Family" Chem. Eur. J. 2012, 18, 14702-14707.*

Martin et al "Poly(triacety1ene) Oligomers: Synthesis, Characterization, and Estimation of the Effective Conjugation Length by Electrochemical, UV/Vis, and Nonlinear Optical Methods" Chrm Lur Jornal 1997 vol. 3. No. 9 pp. 1505-1512.*

Edelmann et al "Poly(triacetylene) Oligomers: Conformational Analysis by X-Ray Crystallography and Synthesis of a 17.8-nm-Long Monodisperse 24-mer" Helvetica Chimica Acta ± vol. 84 (2001) pp. 473-480.*

Deidrich, F. and Kivala, M. "All-Carbon Scaffolds by Rational Design," Advanced Materials, 2010, vol. 22, pp. 803-812.

(Continued)

*Primary Examiner* — Robert M Kunemund
(74) *Attorney, Agent, or Firm* — Kevin W. Bieg; Mario A. Burgarello

(57)        ABSTRACT

Polytriacetylene, a unique conjugated polymer with all-carbon main-chains consisting of alternating double bonds and diacetylene units, can self-assemble into ordered structures under moderate pressures, driven by side-chain crystallization. At higher pressure, the polymer undergoes topochemical cross-linking reactions, resulting in insoluble materials with graphyne-like structural and property characteristics.

9 Claims, 9 Drawing Sheets

(56)             References Cited

OTHER PUBLICATIONS

Edelmann, M. J. et al., "Poly(triacetylene)s: A New Class of Linearly n-Conjugated Oligomers and Polymers with an All-carbon Backbone," Chimia, 2001, vol. 55. pp. 132-138.

Hu, K. et al., "Solution processable polydiacetylenes (PDAs) through acyclic enediyne metathesis polymerization," Chemical Science, 2013, vol. 4, pp. 3649-3653.

Hu, K. et al., "Platinum-Segmented Polydiacetylenes," Journal of Polymer Science a Polymer Chemistry, 2014, vol. 52, pp. 2662-2668.

Hu, K. and Qin, Y. "Polytriacetylenes Bearing Directly Attached Functional Groups with Tunable Physical and Electronic Properties," Journal of Polymer Science, Part A: Polymer Chemistry. 2016, vol. 54, pp. 1391-1395.

Hu, K. et al., "Boron "Doped" Polyacetylenes," Journal of American Chemical Society, 2017, vol. 139, pp. 11004-11007.

Inagaki, M. and Kang, F., "Graphene derivatives: graphane, fluorographene, graphene oxide, graphyne and graphdiyne," Journal of Materials Chemistry A, 2014, vol. 2, pp. 13193-13206.

Li, K. and Liu, B. "Polymer-encapsulated organic nanoparticles for fluorescence and photoacoustic imaging," Chem. Soc. Rev., 2014, vol. 43, pp. 6570-6597.

Meng, L. et al., "Pressure Induced Assembly and Coalescence of Lead Chalcogenide Nanocrystals," Journal of the American Chemical Society, 2021, vol. 143, pp. 2688-2693.

Meng, L. et al., "High pressure induced atomic and mesoscale phase behaviors of one• dimensional TiO2 anatase nanocrystals," MRS Bulletin, 2022, vol. 47, 455-460.

Qin, Y. "Unconventional Conjugated Polymers Derived from a Common Set of trans-Enediyne Monomers," Synlett 2018, vol. 29, pp. 999-1007.

Schreiber, M. et al., "Polytriacetylenes: Conjugated Polymers with a Novel All-Carbon Backbone," Advanced Materials, 1994, vol. 6, pp. 786-790.

Wu, H. et al., "Nanostructured Gold Architectures Formed through High Pressure-Driven Sintering of Spherical Nanoparticle Arrays," Journal of Ameircan Chemical Society, 2010, vol. 132, pp. 12826-12828.

* cited by examiner 0.4 GPa

Ambient Pressure

PRESSURE-INDUCED CRYSTALLIZATION AND TOPOCHEMICAL CROSS-LINKING OF CONJUGATED POLYMERS

FEDERALLY SPONSORED RESEARCH AND DEVELOPMENT

This invention was made with Government support under Contract No. DE-NA0003525 awarded by the United States Department of Energy/National Nuclear Security Administration. The Government has certain rights in the invention.

BACKGROUND OF THE INVENTION

Overcoming activation barriers in the majority of chemical reactions, catalyzed or noncatalyzed, has generally been accomplished by heat. Using photons as energy sources to trigger chemical reactions, i.e., photochemistry, is another long-standing research field that has seen continuous growth in recent years. See N. J. Turro et al., *Modern Molecular Photochemistry of Organic Molecules*, University Science Books: Sausalito (2010). One representative example is the photochemical polymerization of diacetylene crystals into polydiacetylenes (PDAs), which was initially discovered in 1969. See G. Wegner, *Z. Naturforsch.* B24(7), 824 (1969). Certain diacetylene molecules having carefully selected side-chain functionalities can precisely pack into crystals within a narrow range of molecular geometries, which, under light irradiation, can undergo sequential 1,4-addition reactions among adjacent diacetylene units, leading to PDAs as quasi one-dimensional semiconductors having macroscopic long-range coherence and anisotropy. See T. Kim et al., *Langmuir* 12, 6065 (1996); H. Zuilhof et al., "Polydiacetylenes," in *Supramolecular Photosensitive and Electroactive Materials*, Nalwa, H. S., Ed. Academic Press: San Diego, 2001; pp 339-437; and M. Schott, "Optical Properties of Single Conjugated Polymer Chains (Polydiacetylenes)," in *Photophysics of Molecular Materials*, Lanzani, G., Ed. Wiley-VCH: Weinheim, 2006; pp 49-150. Various diacetylene-containing molecules with specifically designed geometries and functions have been photochemically polymerized into different structures that have found a myriad of organic semiconductor applications, e.g., nonlinear optics, organic conductors and biomedical materials. See T. Kanetake et al., *Appl. Phys. Lett.* 54, 2287 (1989); A. Sarkar et al., *J. Mater. Chem.* 10, 819 (2000); H. Nakanishi et al., *Mol. Cryst. Liq. Cryst.* 105, 77 (1984); K. Se et al., *Macromolecules* 17, 2126 (1984); S. R. Diegelmann et al., *J. Am. Chem. Soc.* 134, 2028 (2012); S. R. Diegelmann and J. D. Tovar, *Macromol. Rapid Commun.* 34, 1343 (2013); J. D. Tovar, *Acc. Chem. Res.* 46, 1527 (2013); H. Peng and Y. Lu, *Langmuir* 22, 5525 (2006); H. Peng, *J. Phys. Chem. B* 111, 8885 (2007); and X. Sun et al., *Chem. Soc. Rev.* 39, 4244 (2010). Unlike PDAs, most conjugated polymers are synthesized in solutions from aromatic building blocks that typically possess long and/or branched alkyl side-chains for solubility purposes. As a result, the majority of these conjugated polymers are amorphous except for a few semicrystalline examples, such as regio-regular poly(3-hexylthiophene) (rr-P3HT). In organic electronic devices employing conjugated polymers, it is often essential for these polymers to assemble into ordered structures to maximize delocalization and conductivity through intermolecular interactions. In this regard, thin films of conjugated polymers are typically obtained by spin-coating and molecular order is induced by slow solvent removal and thermal annealing processes. See J.-T. Chen and C.-S. Hsu, *Polym. Chem.* 2, 2707 (2011); F.

S. Kim et al., *Chem. Mater.* 23, 682 (2011); J. Kim, *Pure & Appl. Chem.* 74, 2031 (2002); N. E. Persson et al., *Acc. Chem. Res.* 50, 932 (2017); and W. Dierckx et al., *J. Mater. Chem. C* 2, 5730 (2014). However, the majority of conjugated polymers form amorphous films containing varied amount of crystalline domains using these conventional methods.

SUMMARY OF THE INVENTION

The present invention is directed to a method for the pressure-induced crystallization of topochemical cross-linking of conjugated polymers, comprising self-assembling a polytriacetlyene to provide an ordered 3D structure of polytriacetylene aggregate, and applying a moderate pressure to the polytriacetylene aggregate to provide a crystallized polytriacetylene aggregate. For example, the moderate pressure can be greater than 0.2 GPa and less than 4 GPa. The method can further comprise applying a higher pressure to the crystallized polytriacetylene aggregate to provide a topochemically crosslinked polytriacetylene having a graphyne-like structure. For example, the higher pressure can be greater than 4 GPa. The polytriacetlyene can contain either no alkyl side chains or alkyl side chains, preferably linear trans alkyl side chains, with a chain length ranging from 1 to 30 carbons. The polytriacetlyene can be obtained by the polymerization of an enediyne monomer, such as an alkylated trans-enediyne monomer.

As an example of the invention, the effect of pressure on self-assembly and topochemical cross-linking reactions of poly(undecyl triacetylene), PTA-CH, was demonstrated. With a low pressure of 0.4 GPa, polymer crystallization in the solid-state was observed, driven by pressure-induced side-chain ordering. This effect was reversible until when the pressure was raised to ca. 4.3 GPa, when inter-chain cross-linking reactions took place. Such cross-linking reactions involve addition and cyclization of triple bonds among adjacent polymer chains, leading to highly cross-linked materials with graphyne-like characteristics. Therefore, pressure can be utilized to induce chemical reactions in tailored polymer structures, where conventional means such as heat and irradiation are incapable.

BRIEF DESCRIPTION OF THE DRAWINGS

The detailed description will refer to the following drawings, wherein like elements are referred to by like numbers.

FIG. 4D is a model of a PTA-CH model under elevated pressure, demonstrating crystallization of alkyl chains. Upper and lowers panels in FIGS. 5C and 5D show top-views and side-views.

DETAILED DESCRIPTION OF THE INVENTION

Topochemical reactions refers to reactions wherein the structure of the product is dictated by the geometry and proximity of the reactive sites of the precursors in the lattice. Topochemical reactions have been extensively studied in organic and polymer chemistry, and are conventionally triggered by heat and/or light. Pressure, as one of the fundamental thermodynamic parameters, has recently been applied to study phase transitions of inorganic and hybrid nanomaterials on both microscopic and macroscopic scales. Relatively fewer studies have been focused on high-pressure behaviors, especially pressure-induced reactions, on organic and polymer molecules and assemblies. Polytriacetylenes (PTAs) are unique conjugated polymers with all-carbon main chains consisting of alternating double bonds and diacetylene units. Although diacetylene units are prime examples capable of light-induced topochemical polymerization into polydiacetylene, PTAs are found to be very stable under light irradiation. However, as described below, applying low pressure leads to crystallization and ordering of PTAs bearing linear alkyl side chains. Further increasing pressure leads to irreversible cross-linking reactions, resulting in materials of graphyne-like structures, appearances, optical properties, and solubilities. Thus, the present invention is directed to using pressure to guide conjugated polymer self-assembly and to induce topochemical reactions.

Figure 1:
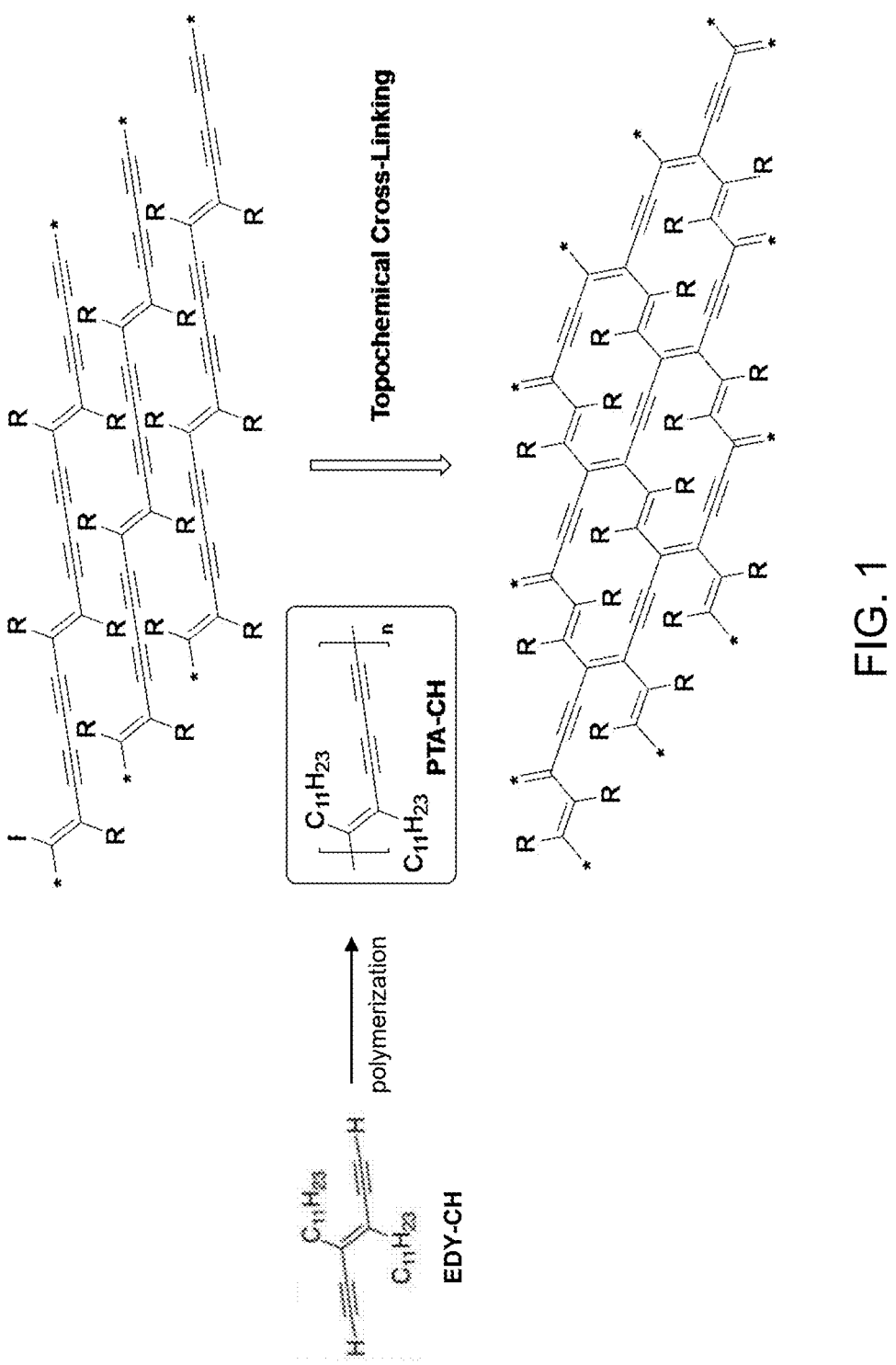
FIG. 1 is a schematic illustration of the chemical structure of poly(undecyl triacetylene) (PTA-CH) and topochemical cross-linking to a graphyne-like structure.

A series of trans-enediyne (TEDY) monomers bearing different substituents at the central double bonds have recently been synthesized and used as a common set of monomers to access a wide range of conjugated polymer materials. See K. Hu et al., *Chem. Sci.* 4, 3649 (2013); K. Hu et al., *J. Polym. Sci. A Polym. Chem.* 52, 2662 (2014); K. Hu and Y. Qin, *J. Polym. Sci. A Polym. Chem.* 54, 1391 (2016);

K. Hu et al., *J. Am. Chem. Soc.* 139, 11004 (2017); and Y. Qin, *SynLett* 29, 999 (2018). One particular product, namely polytriacetylene (PTA), was efficiently synthesized through Glaser-Hay type coupling reactions of these tEDY monomers. See K. Hu and Y. Qin, *J. Polym. Sci. A Polym. Chem.* 54, 1391 (2016). PTAs are conjugated polymers with main-chains consisted of repeating diacetylene and double bond units. See M. Schreiber et al., *Adv. Mater.* 6, 786 (1994); and M. J. Edelmann et al., *Chimia* 55, 132 (2001). FIG. 1 shows the structure an exemplary PTA polymer, PTA-CH, bearing linear alkyl side-chains, synthesized from an alkylated trans-enediyne monomer, EDY-CH. X-ray diffraction (XRD) studies on thin films of PTA-CH displayed distinct scattering signals, suggesting certain crystallinity of this polymer resulted from close packing of polymer main- and side-chains.

It was hypothesized that if the diacetylene units between adjacent polymer chains can undergo light-induced topochemical reactions, such as those in the synthesis of PDAs, then PTA-CH can be converted into highly cross-linked graphyne-like materials with two-dimensional conjugation/delocalization via an infinite web composed of double and triple bonds. See F. Diederich and M. Kivala, *Adv. Mater.* 22, 803 (2010); M. Inagaki and F. Kang, *J. Mater. Chem. A* 2, 13193 (2014); and Y. Li et al., *Chem. Soc. Rev.* 43, 2573 (2014). Conventionally, graphyne is an allotrope of carbon and an atomic thin layer of network composed of sp and $sp^2$ hybridized carbon atoms. Existing examples of graphyne are exclusively composed of benzene rings, i.e., $sp^2$ carbons, interconnected by triple bonds, which are chemically synthesized from alkynyl benzene derivatives through Glaser-Hay coupling, Sonagashira coupling, and alkyne metathesis reactions. See Y. Li et al., *Chem. Soc. Rev.* 43, 2573 (2014); G. Li et al., *Chem. Commun.* 46, 3256 (2010); J. Zhou et al., *J. Am. Chem. Soc.* 137, 7596 (2015); and Y. Hu et al., *Nat. Synt.* 1, 449 (2022). The graphyne-like structure in FIG. 1 mimics those of α- and β-graphynes, which contain only double and triple bonds, but with distinct connectivities. Thus, it represents a new type of graphyne-like material if the topochemical cross-linking proceeds through 1,4-addition reactions among adjacent diacetylene units. However, when PTA-CH films were subjected to intense UV irradiations for extended periods of time up to days, no chemical reactions were observed at all and only the starting materials were recovered quantitatively.

Pressure is another elementary thermodynamic property that can be precisely manipulated to generate work and control phase transitions at macroscopic levels, and at the atomic/molecular level, to create new phases and chemical structures in crystalline materials. See W. B. Holzapfel, *Rep. Prog. Phys.* 59, 29 (1996); P. F. McMillan, *Nat. Mater.* 1, 19 (2002); P. F. McMillan, *High Pressure Res.* 23, 7 (2003); P. F. McMillan, *Chem. Soc. Rev.* 35, 855 (2006); L. Zhang et al., *Nat. Rev. Mater.* 2, 17005 (2017); S. H. Tolbert and A. P. Alivisatos, *Science* 265, 373 (1994); S. H. Tolbert and A. Alivisatos, *Annu. Rev. Phys. Chem.* 46(1), 595 (1995); and S. H. Tolbert et al., *Phys. Rev. Lett.* 76, 4383 (1996). High pressure is typically achieved using diamond anvil cells (DACs) that can generate compression up to hundreds of GPa. See F. Bai et al., *Chem. Rev.* 119(12), 7673 (2019). Coupled with in-situ analytical techniques, including optical spectroscopy and synchrotron XRD, one can carefully study material phase and property changes under increasing pressure conditions. In the chemical research field, high pressure experiments using DACs have been mainly focused on inorganic and semiconducting nanoparticles. See H. Wu et al., *Angew. Chem. Int. Ed.* 49(45), 8431 (2010); H. Wu et al.,

*J. Am. Chem. Soc.* 132(37), 12826 (2010); B. Li et al., *Nat. Commun.* 8 (1), 14778 (2017); B. Li et al., *Sci. Adv.* 3(5), e1602916 (2017); B. Li et al., *Nat. Commun.* 5 (1), 4179 (2014); W. Li et al., *Nano Lett.* 14(9), 4951 (2014); W. Grochala et al., *Angew. Chem. Int. Ed.* 46, 3620 (2007); and G. Shen and H. K. Mao, *Rep. Prog. Phys.* 80, 016101 (2016). Organic molecules and polymers have been relatively less studied under compression conditions, among which molecules containing less stable functional groups have been shown to react under high pressure. For example, fullerene molecules have been shown to dimerize, polymerize, and amorphize under pressure to generate novel phases and materials. See S.-H. Ruan et al., *Chin. Phys. B* 29, 026402 (2020); M. Du et al., *J. Phys. Chem. C* 125, 17155 (2021); and Y. Shang et al., *Nature* 599, 599 (2021). Crystals of organic molecules containing reactive triple bonds have also been shown to polymerize under high pressure. See J. Han et al., *RSC Adv.* 12, 11996 (2022); and J. Han et al., *J. Phys. Chem. C* 123, 30746 (2019).

Figure 2:
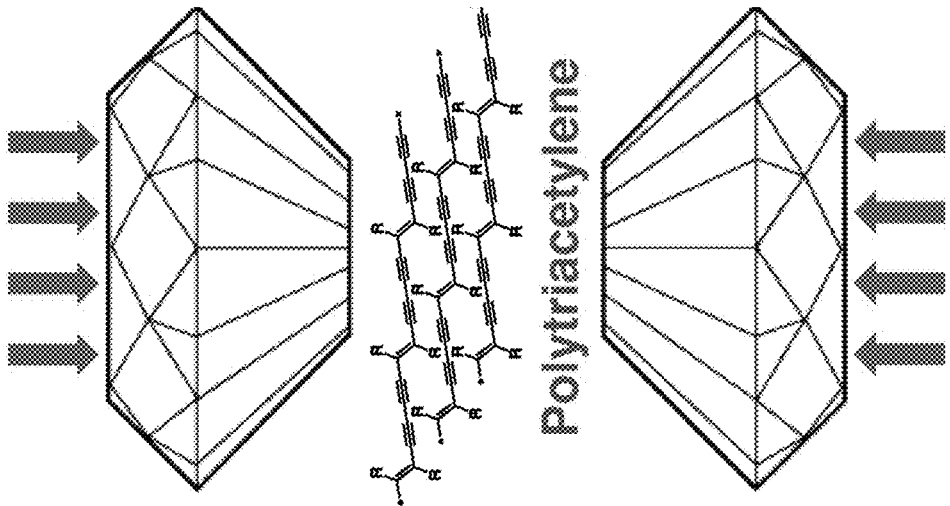
FIG. 2 is a schematic illustration of a diamond anvil cell (DAC) used for topochemical cross-linking of PTA-CH.

The present invention is directed to the self-assembly and pressure-induced cross-linking of polytriacetylenes. As an example, the topochemical cross-linking of PTA-CH was demonstrated using high pressure, as shown in FIG. 1. A DAC technique was used to trigger the reaction, as shown in FIG. 2, with in-situ X-ray and optical characterization. Enhanced ordering by crystallization of alky-side chains was achieved at a relatively low pressure of 0.4 GPa, which was reversible upon pressure release. At higher pressure, irreversible chemical reactions were observed, leading to insoluble materials bearing structural and electronic properties pertaining to graphyne-like materials.

Synthesis of PTA-CH

Poly(undecyl triacetylene) (PTA-CH) was synthesized by Glaser-Hay type coupling reaction. See K. Hu and Y. Qin, *J. Polym. Sci. A Polym. Chem.* 54, 1391 (2016). To a mixture of EDY-CH (100 mg, 0.26 mmol) and CuBr (48 mg, 0.34 mmol) were added 5 mL of 1,2-dichlorobenzene (kept over 4 Å molecular sieves), phenylacetylene (0.2 mg, 0.002 mmol) and tetramethylethylenediamine (0.06 mL, 0.4 mmol). The reaction mixture was stirred in air at 80° C. overnight. 10 mL chloroform was then added to the resulting viscous reaction mixture to dissolve the polymer and then the mixture was subject to column chromatography and eluted by chloroform. The polymer solution was concentrated to cal. 6 mL and precipitated in methanol, filtrated and dried under high vacuum to afford 88 mg (88.7%) red waxy solid. The structure of PTA-CH was confirmed by NMR and its molecular weight was estimated by size exclusion chromatography (SEC) against polystyrene standards. The number average molecular weight (Mn) of this polymer was estimated to be ca. 19.5 kg/mol with a polydispersity index (Đ) of 1.98.

Self-Assembly of PTA-CH

As in the case for topochemical polymerization toward polydiacetylenes, highly ordered structures are necessary for controlled reactions. To obtain insights into structural response to mechanical pressure using X-ray scattering techniques, an ordered aggregate of the PTA-CH is desired. As the degree of microscopic ordering increases, stronger and sharper characteristic peaks can be seen in XRD patterns. On the other hand, according to previous work on stress-induced sintering of nanoparticles, a highly ordered array of nanoparticles as the starting material is essential to successful sintering and formation of higher-order nanostructures. See H. Wu et al., *J. Am. Chem. Soc.* 132 (37), 12826 (2010); L. Meng et al., *J. Am. Chem. Soc.* 143, 2688 (2021); and L. Meng et al., *MRS Bullet.* 47, 455 (2022). Therefore, a highly ordered arrangement of the PTA-CH polymer can be expected to provide a higher likelihood of inter-molecular cross-linking under pressure.

Borrowing the idea of self-assembly of nanoparticles, self-assembly of highly ordered PTA-CH aggregates was carried out by slow solvent evaporation while being heated at preset temperatures. PTA-CH was dissolved in o-dichlorobenzene at 60° C. to form a 10 mg/mL solution. The solution was clear and showed a red color. As it cooled down to room temperature, the solution turned cloudy. This is due to the decreased solubility as temperature dropped. Upon heating, the precipitated PTA was re-dissolved into transparent solution again. 0.5 mL of PTA-CH solution was transferred to an 8 mL glass vial. Then the vial was placed in an oven set at a temperature between 5° and 160° C. The vial was partially sealed to allow very slow evaporation which took about one week. Upon complete removal of dichlorobenzene, PTA-CH aggregate was obtained at the bottom of the vial.

Figure 3A:
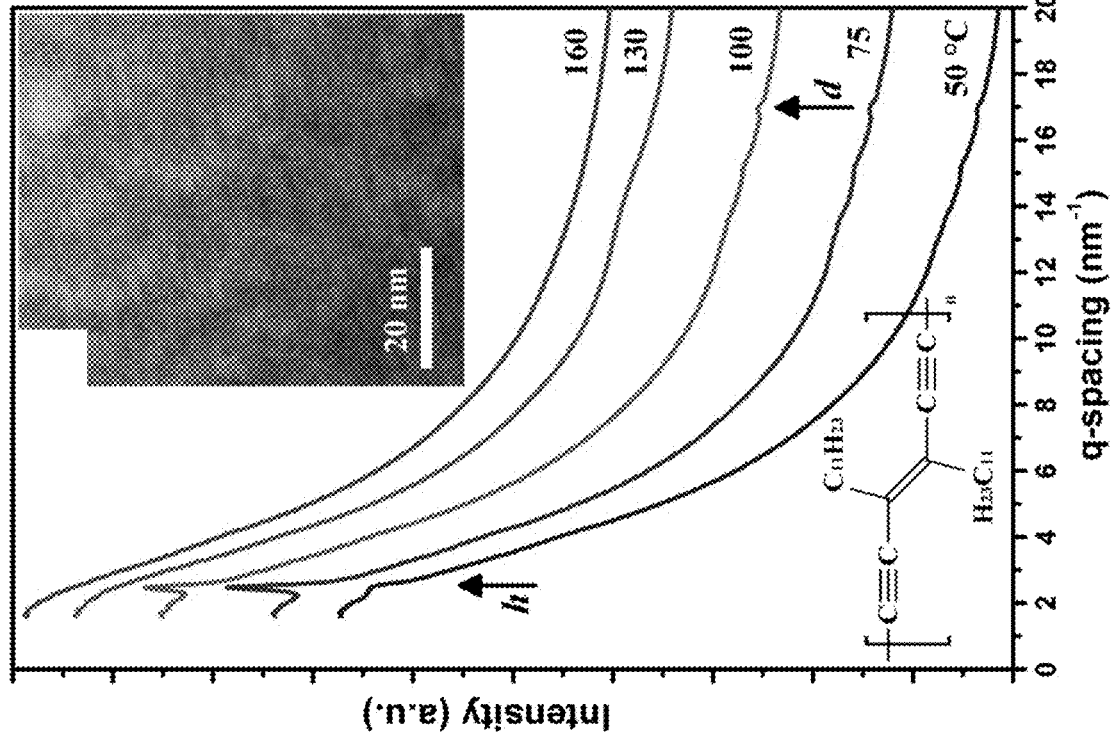
FIG. 3A shows X-ray diffraction (XRD) patterns of self-assembled PTA-CH aggregates formed by slow solvent evaporation under different temperatures. The patterns were directly integrated from 2D raw data without further processing and displayed with vertical offset only. Inset is a transmission electron microscopy (TEM) image of a PTA-CH thin film showing the stripes with pitch matching the PTA-CH slabs.

FIG. 3A compares the XRD patterns from PTA-CH films prepared by slow solvent evaporation of identical solutions but under different temperatures ranging from 50 to 160° C. It was found that heating at 75° C. resulted in the highest degree of ordering as indicated by its strongest diffraction peaks. This optimal temperature can be explained by the solubility of polymer and the balance between enthalpy and entropy during the self-assembly process. At the low-end temperatures, the polymer was only partially dissolved and therefore the molecule chains were not fully stretched, which eventually hinders the formation of ordered structures. At high enough temperatures, polymer chains were fully dissolved and possessed enough thermal energy. In this regime, the self-assembled structure was determined thermodynamically by minimizing free energy changes $\Delta G=\Delta H-T\Delta S$. For the self-assembly process, both $\Delta H$ and $\Delta S$ are negative. At moderate T, the $\Delta H$ term dominates so that ordering is thermodynamically favorable. As T further increases, the entropy term $T\Delta S$ plays a more dominating roll over $\Delta H$ and disordering is now the thermodynamic product. Consequently, an intermediate temperature of 75° C. was found to produce the most ordered PTA-CH sample, which was used in the following experiments.

Figures 3B, 3C:
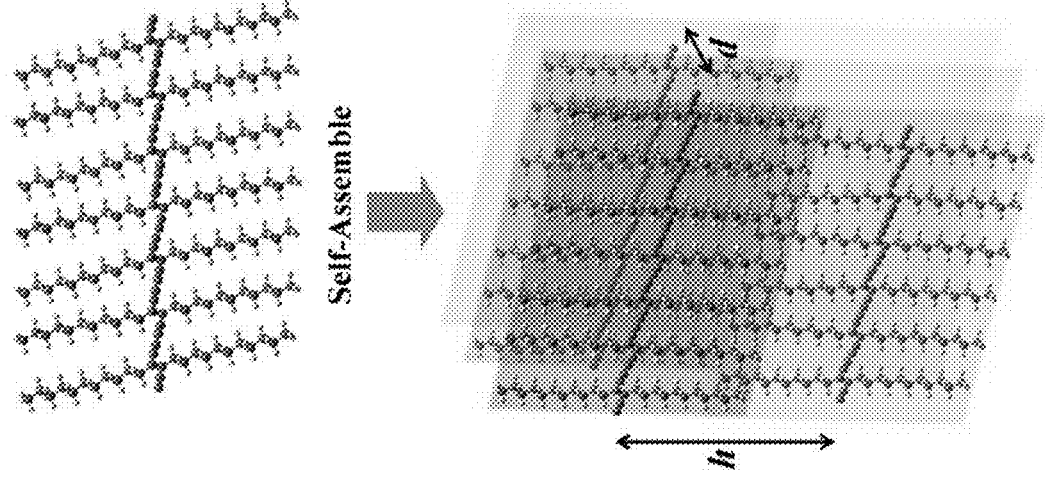
FIG. 3B is a schematic illustration of a single PTA-CH chain.
FIG. 3C is a schematic illustration of the self-assembled ordered structure. The PTA-CH layers in two neighboring slab are highlighted with different shades for visual aid.
Figure 4:
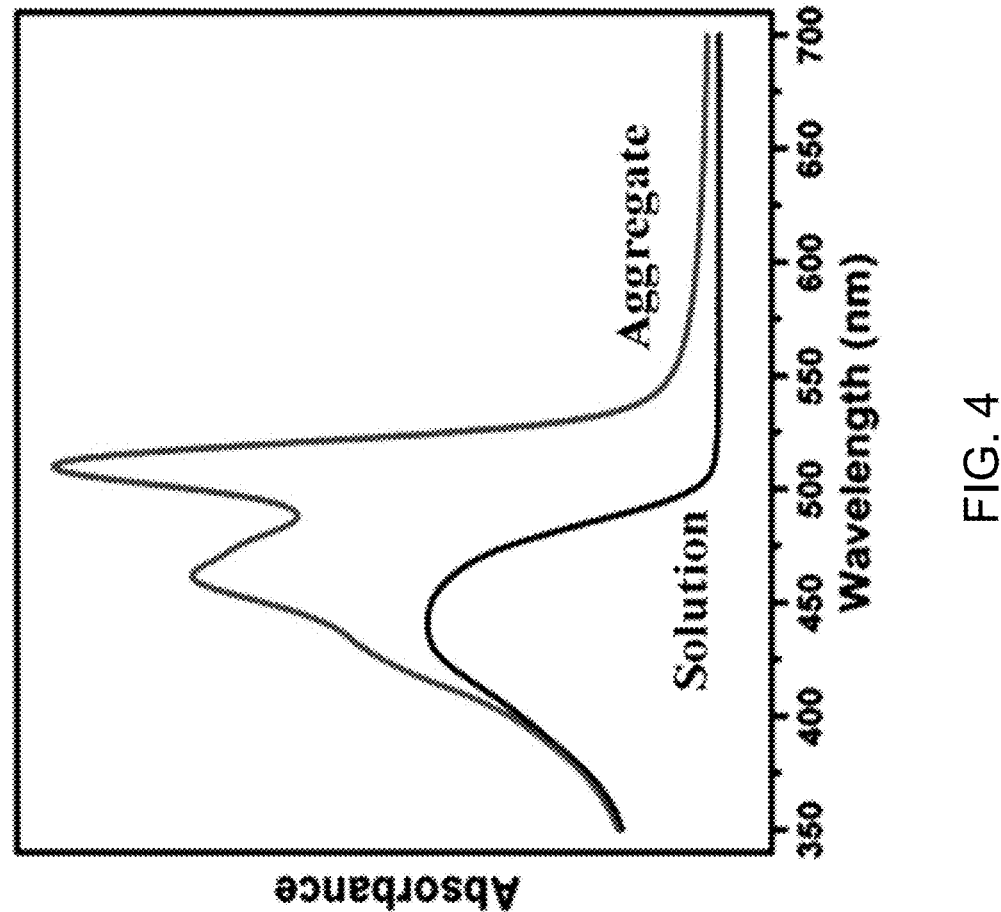
FIG. 4 shows optical absorption spectra of PTA-CH solution and aggregate from slow solvent evaporation at 75° C.

As seen from FIG. 3A, two obvious XRD peaks at h=25.3 Å and d=3.71 Å were identified. These peaks can be explained by a layer-slab model (FIGS. 3B and 3C) with side-chain lamellar (h) and T-T stacking (d) features commonly observed in self-assembly of conjugated polymers such as rr-P3HT. See N. E. Persson et al., *Acc. Chem. Res.* 50, 932 (2017); W. Dierckx et al., *J. Mater. Chem. C* 2, 5730 (2014); F. Li et al., *Chem. Mater.* 26, 3747 (2014); F. Li et al., *Polym. Chem.* 6(5), 721 (2015); F. Li et al., *Macromolecules* 46, 9021 (2013); and F. Li et al., *Polymer* 76, 220 (2015). In this model, each polymer chain forms a planar layer as the consequence of conjugation along the main-chain double and triple bonds. These layers π-π stack to form slabs with separation d. The slabs then stack at a pitch h to build the ordered 3D structure in PTA-CH aggregate. It is noticeable that the pitch of the slabs h=25.3 Å is slightly smaller than the theoretical thickness of the slabs of 28-29 Å, i.e., twice of the length of a fully stretched C11 alkyl chain. Such difference can be explained by partial intercalation between the aliphatic C11 side chains via Van der Waals attraction. The slabs were directly imaged as the stripes with matching pitch in the TEM image (inset in FIG. 3A), validating the solid-state model. Furthermore, optical absorption spectroscopy of PTA-CH both in solutions and in thin films was conducted. As shown in FIG. 4, a significant bathochromic shift and emergence of the 0-0 transition peak in thin films suggest the formation of J-aggregates as a result of strong main-chain conjugation by structural ordering. See F. C. Spano, *Acc. Chem. Res.* 43, 429 (2010).

Low Pressure-Induced Crystallization

Figures 5A, 5B:
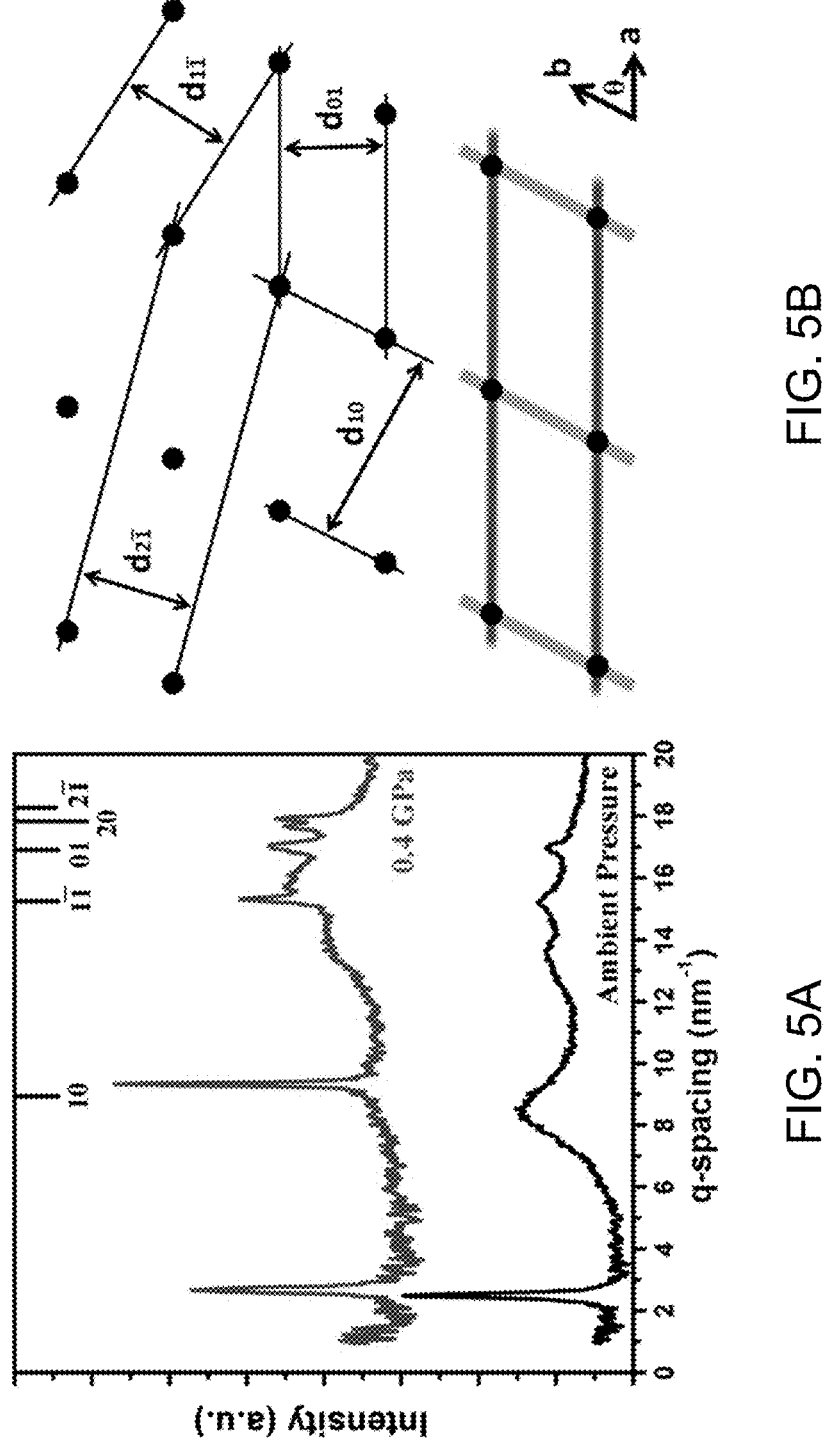
FIG. 5A shows XRD patterns (background removed) of self-assembled PTA-CH films under ambient and 0.4 GPa pressure. Calculated peak positions based on the oblique lattice are indicated by the black bars at the top with corresponding Miller indices labeled.
FIG. 5B is a schematic illustration of the oblique lattice and the corresponding spacings. Black dots represent arrangement of alkyl chains.

Structure of the PTA-CH aggregate was studied under elevated pressure in a DAC by in-situ XRD measurements. As shown in FIG. 5A, when a pressure of 0.4 GPa was applied, additional scattering peaks appeared while the existing peaks became sharper and stronger. This is a clear indication of further improvement of ordering. Therefore, pressure-induced crystallization occurred. Similar behaviors have been observed in many organic molecules, polymers, and even ligands attached to nanoparticles. Such crystallization is a result of the $\Delta(PV)$ term in $\Delta H$ formulation that dominates over $T\Delta S$ in free energy changes during crystallization processes. More specifically, for compression under high pressure, $\Delta V$ is generally negative while $\Delta P$ is positive, which leads to a negative $\Delta(PV)$ and thus negative $\Delta H$. The higher the pressure, the more negative $\Delta H$, leading to more thermodynamically favored crystallization processes. As no sharp peak appeared at 0.2 GPa, a moderate pressure of at least 0.4 GPa can help overcoming the limitation of solubility and lack of thermal energy to achieve highly ordered structures. In this way, pressure provides a valuable tool to understand packing behaviors of soft materials and corresponding underlying mechanisms.

Upon careful analysis, all the sharp peaks on the 0.4 GPa XRD pattern, except for the one near 2.5 $nm^{-1}$ (the h peak), were best fitted to a 2D oblique lattice with lattice parameter a=7.86 Å, b=4.16 Å and $\theta=63.9°$. Three unit cells are outlined by the horizontal and tilted frames (lower schematic in FIG. 5B). The experimental peaks from low q to high q were identified as (10), (1$\bar{1}$), (01), (20) and (2$\bar{1}$) which were compared with calculated values based on the oblique lattice symmetry. The spacings between corresponding planes are illustrated in the upper schematic in FIG. 5B. This oblique lattice was attributed to crystallized C11 side-chains contained in each slab. Each lattice point is occupied by a side chain looking along its long axis. The sharp second-order peaks revealed a highly ordered crystalline phase of the alkyl chains under moderate pressure. In this model the polymer layers, shown as horizontal lines, then form the a-c plane, where c is the axis perpendicular to page. The inter-layer distance d is then represented by $d_{01}$. The distance between two neighboring side chains on the same PTA-CH molecule is given by a which is comparable with the theoretical estimate of 7.6 Å in a single polymer chain.

Figures 5C, 5D:
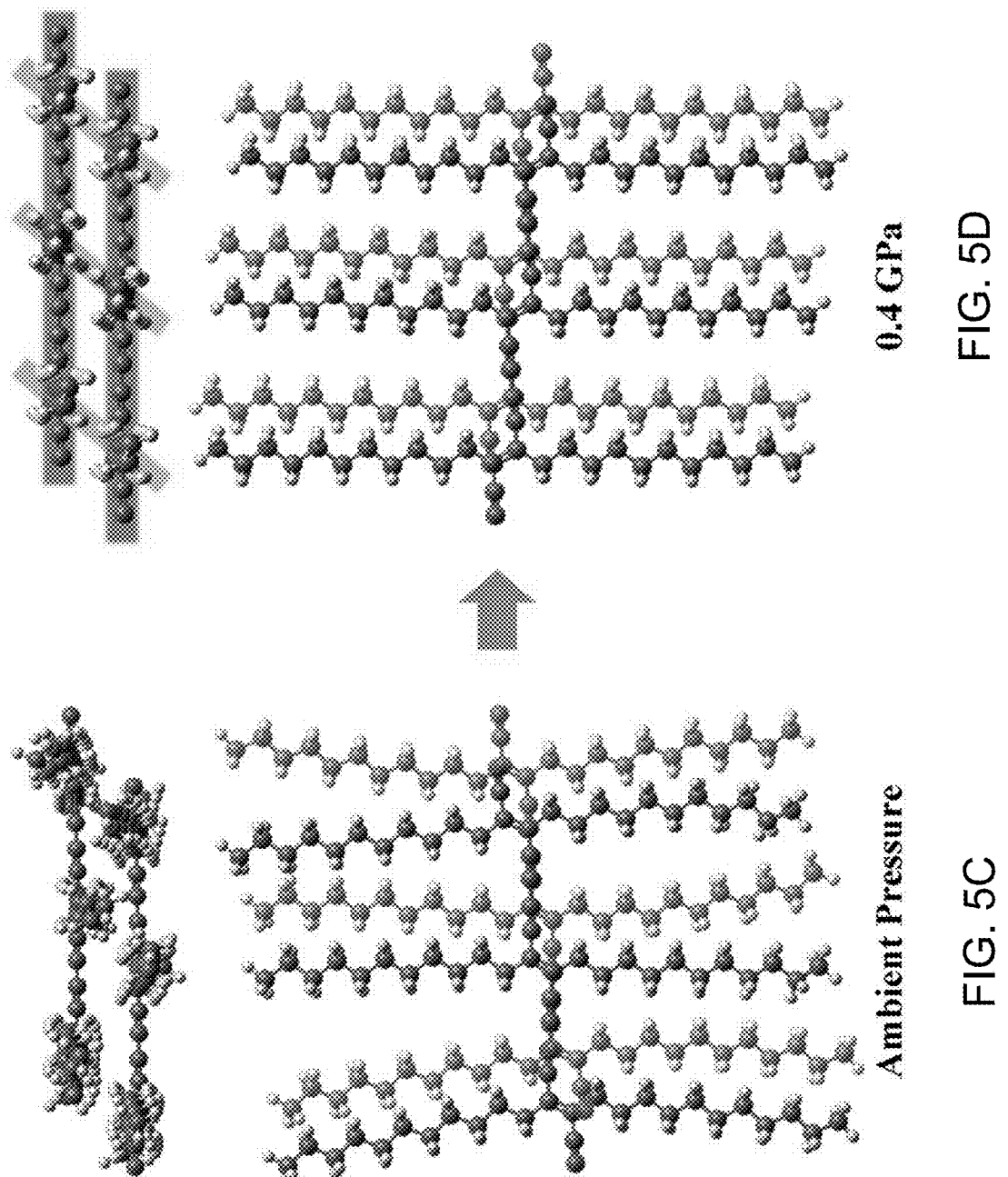
FIG. 5C is a model of a PTA-CH slab under ambient pressure.

With the lattice structure identified, the disorder-to-order transition of the alkyl chains during pressure-induced crystallization can be studied by comparing the XRD patterns at 0 and 0.4 GPa. Under ambient pressure, only first order peaks (10) and (01) from the side chains are observed. Under pressure of 0.4 GPa, two types of pronounced changes occurred, as shown in Table 1. First, both peaks shifted to higher q value meaning shrinkage of d spacing, and therefore the volume, by ca. 10%. Second, the width of peaks reduced significantly indicating substantial improvement of ordering. The fact that peak narrowing is much more dramatic in (10) than (01) reveals that crystallization mainly took place within each PTA-CH layer, as demonstrated by the model shown in FIGS. 5C and 5D. As shown in FIG. 5C, during self-assembly of PTA-CH, the side chains have more spatial freedom within the molecule layer, i.e., the a-c planes, than out of the plane due to the space created by the acetylene scaffold. Additionally, considering the randomness introduced by intercalation between neighboring slabs, weak in plane ordering is expected. As shown in FIG. 5D, when pressurized, the tendency to reduce volume and strong inter-layer sterical repulsion force the alkane chains to align parallel with each other to transform into the highly order crystalline phase which leads to peak sharpening and observation of higher order XRD peaks.

TABLE 1

Comparing center and half width at half maximum (HWHM) of (10) and (01) XRD peaks of self-assembled PTA-CH films under ambient and elevated pressure.

| Pressure | $d_{10}$ (nm) | $q_{10}$ ($nm^{-1}$) | HWHM ($nm^{-1}$) | $d_{01}$ (nm) | $q_{01}$ ($nm^{-1}$) | HWHM ($nm^{-1}$) |
|---|---|---|---|---|---|---|
| 0 GPa | 7.48 | 8.40 | 0.791 | 3.70 | 16.96 | 0.161 |
| 0.4 GPa | 6.74 | 9.32 | 0.058 | 3.69 | 17.01 | 0.126 |
| Change | −9.9% | 11.0% | −92.7% | −0.3% | 0.3% | −21.7% |

Pressure-Induced Topochemical Reaction

The decoded correlation between XRD patterns and structure of PTA-CH aggregates was then used to investigate its behavior under higher pressures. The sample was compressed up to ca. 9 GPa in a DAC while the structural changes were monitored by in-situ XRD. Two compression cycles were performed in order to reveal any permanent pressure-induced property changes. Selected data is presented in FIG. 6A. A general trend observed upon pressurization is the shift of all peaks to higher q values, indicating reduced spacings in real space. Upon pressure releases, the peaks shifted back to approximately the original locations via nearly the same paths. Similar behaviors were reproduced in the second compression cycle. The only exception is peak h, which showed that the pitch of slabs initially decreased with raising pressure but began to increase above about 5 GPa. When pressure was completely released in the first cycle, the h spacing was found to be 28 Å, a pronounced increment from the starting 25.3 Å. After the second cycle, the h peaks remained at 28 Å. This clearly reveals permanent removal of side chain intercalation between neighboring slabs and hence indicates transition of the interaction between PTA-CH layers from loose Van der Waals stacking to strong binding.

Figures 6A, 6B, 6C:
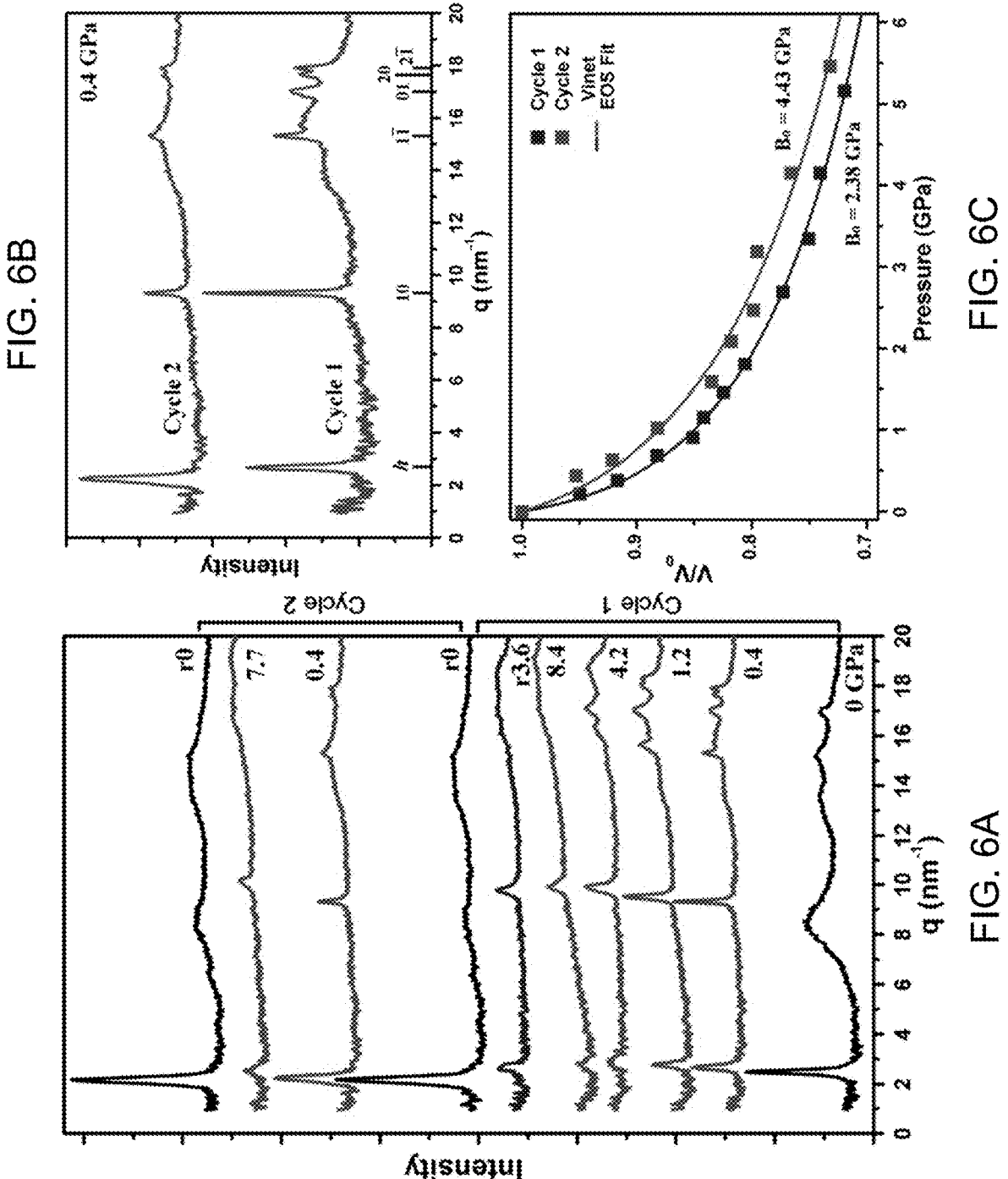
FIG. 6A shows selected XRD patterns of self-assembled PTA-CH at elevated pressures during two consecutive compression cycles. Pressure values, which were measured by ruby fluorescence method, are listed; "r" represents pressure release or decompression.
FIG. 6B shows a comparison of XRD patterns at 0.4 GPa from the two cycles, normalized with respect to peak h. Miller indices are labeled.
FIG. 6C shows a comparison of mechanical stiffness of PTA-CH aggregate before and after compression. The data points were fitted to Vinet equation-of-state which is presented by solid lines.

In terms of the C11 side-chains, as pressure increased in the first cycle, the sharp peaks from the oblique lattice gradually weakened and broadened. They did not recover when pressure was released, indicating that the ordering among the side chains was destroyed by stress. To probe any permanent pressure-induced structural changes, the sample was compressed to 0.4 GPa again to trigger crystallization of the oblique lattice. A comparison between the XRD patterns obtained from two compression cycles unveiled two facts (FIG. 6B). First, when normalized with respect to the h peak, it is seen that the oblique peaks became weaker after the first round of compression. Peaks (1$\bar{1}$), (20) and (2$\bar{1}$) almost blended into background indicating nearly total loss of ordering between layers. Only peak (10) remained sharp and strong enough to be well-resolved, thanks to the relatively rigid triacetylene scaffold which keeps the side chains at a constant separation. Second and more importantly, peak (01) disappeared completely. The missing peak (01) and significant weakening of other high-order peaks suggest cross linking between the unsaturated bonds on the scaffold chains. Upon cross linking, separated neighboring PTA layers join to form a more robust slab, accompanied by intercalation removal. The separation between layers then became vague and therefore deteriorated peak (01). Furthermore, cross-linking reduced the amount of unsaturated bonds which contained higher electron density that scatters X-ray more efficiently, thus contributing to the disappearance of peak (01).

To support the conclusion of PTA-CH cross-linking, the mechanical stiffness of the polymer was calculated from the high-pressure XRD data. To do so, normalized volume of a slab was first calculated by:

$$\frac{V}{V_0} = \frac{d_h \cdot d_{1T}^2}{d_{h,0} \cdot d_{1T,0}^2} \tag{1}$$

The subscripts 0 indicate initial values at ambient pressure. Then the data points were fitted to Rose-Vinet equation-of-state (Eq. 2) to obtain the bulk modulus of the sample, $$P = 3B_0 \left(\frac{V}{V_0}\right)^{-2/3} \left[1 - \left(\frac{V}{V_0}\right)^{1/3}\right] \exp\left\{1.5(B_0' - 1)\left[1 - \left(\frac{V}{V_0}\right)^{1/3}\right]\right\} \tag{2}$$

where $B_0 = B|_{P=0}$ is the bulk modulus under ambient pressure, and $B'_0 = dB/dP|_{P=0}$ is the initial slope. The fitted EOS curves are overlaid with experimental results in FIG. 6C. It was found that the bulk modulus $B_0$ increased to 4.43 GPa after the first compression cycle, almost doubled from the initial 2.38 GPa. The improved stiffness is strong evidence for cross-linked PTA-CH layers. In addition, the solubility of compressed PTA-CH was also tested and compared to that of initial sample. It was found that the as-assembled PTA-CH can be easily redispersed in warm (60° C.) dichlorobenzene while the compressed sample showed no sign of dissolving. This is another indication of inter-layer cross-linking.

Figures 7A, 7B, 7C:
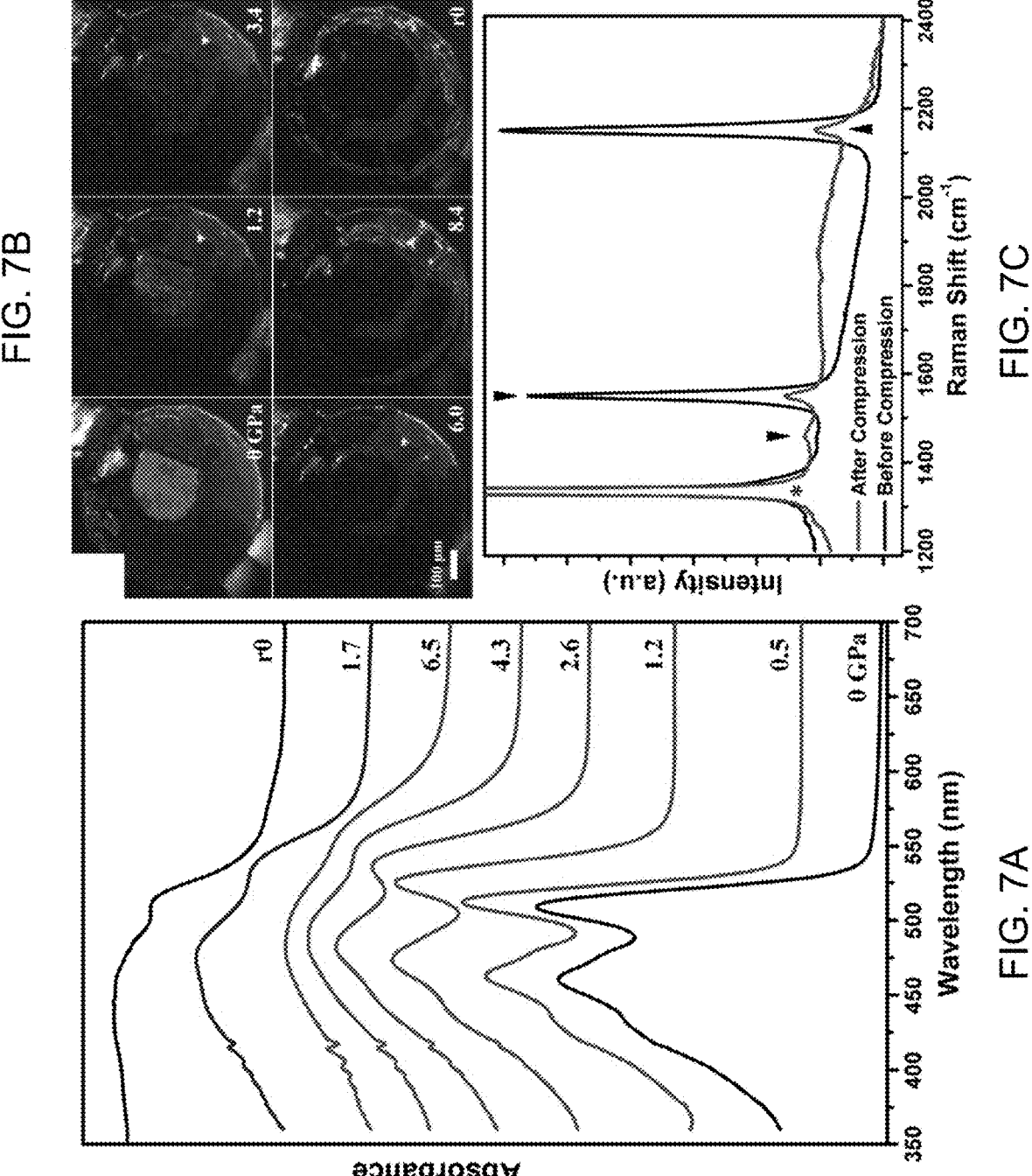
FIG. 7A shows UV-Vis absorption spectra of PTA-CH aggregate under elevated pressures.
FIG. 7B shows optical micrographs of PTA-CH sample being pressured in a DAC. The sample was loaded in a hole ($\phi$250 μm) drilled on a pre-indented steel gasket.
FIG. 7C shows Raman spectra before and after compression up to 8.5 GPa. The peaks from PTA-CH are labeled by the triangles. The strong peak marked by asterisk is from the diamond window.

Optical characteristics of the compressed PTA sample further support topochemical cross-linking. UV-Vis absorption spectra were collected in-situ under pressure (FIG. 7A). Below 4.3 GPa, as pressure increased the absorption displayed a bathrochromic shift while the shape of the peaks remained. This can be explained by enhance electronic coupling between approaching PTA-CH molecules. When pressure exceeded 4.3 GPa, where cross-linking began to occur, the peaks were obviously broadened into wide humps. After pressure was released, the sharp peaks never recovered. The changes in absorption can also be visually observed, as shown by a series of micrographs of the PTA-CH sample loaded in the diamond anvil cell, shown in FIG. 7B. The sample was initially red in color and relatively transparent. During compression its color became dark brown and eventually opaque above ~4 GPa. The color was not restored by decompression, in agreement with absorption measurements.

Raman spectra of PTA-CH aggregate were collected before and after compression up to 8.5 GPa (FIG. 7C). Self-assembled PTA-CH showed two strong peaks at 1550 and 2150 cm$^{-1}$ corresponding to stretching vibration of double bonds and triple bonds, respectively. The sharpness of these peaks and the clean baseline confirmed that all the unsaturated bonds are in a uniform chemical environment, i.e., individual PTA-CH molecules. After compression, the intensity of both peaks dramatically weakened indicating significantly changed chemistry of these bonds. This can be explained by cross-linking between PTA-CH layers. Cross-linking re-positioned the original double bonds and transformed the diacetylenic units into rearranged double/triple bonds, which contributes to the broad hump between the two initial Raman peaks. Another feature which appears after compression is a weak peak at 1458 cm-1, which can be assigned to chain vibrations of aromatic rings that are formed by cyclization reactions among triple bonds.

The present invention has been described as pressure-induced crystallization of topochemical cross-linking of conjugated polymers. It will be understood that the above description is merely illustrative of the applications of the principles of the present invention, the scope of which is to be determined by the claims viewed in light of the specification. Other variants and modifications of the invention will be apparent to those of skill in the art.

The invention claimed is:

1. A method for the pressure-induced crystallization of topochemical cross-linking of conjugated polymers, comprising:
    self-assembling a polytriacetlyene to provide an ordered 3D structure of polytriacetylene aggregate, and
    applying a moderate pressure to the polytriacetylene aggregate sufficient to provide a crystallized polytriacetylene aggregate.

2. The method of claim 1, wherein the moderate pressure is greater than 0.2 GPa and less than 4 GPa.

3. The method of claim 1, further comprising applying a higher pressure to the crystallized polytriacetylene aggregate sufficient to provide a topochemically crosslinked polytriacetylene having a graphyne-like structure.

4. The method of claim 3, wherein the higher pressure is greater than 4 GPa.

5. The method of claim 1, wherein the polytriacetlyene comprises alkyl side chains.

6. The method of claim 5, wherein the alkyl side chains have a chain length ranging from 1 to 30 carbons.

7. The method of claim 5, wherein the alkyl side chains are trans.

8. The method of claim 5, wherein the alkyl side chains are linear.

9. The method of claim 1, wherein the polytriacetylene comprises poly(undecyl triacetylene).

* * * * *